US006897796B2

(12) United States Patent
Dias et al.

(10) Patent No.: US 6,897,796 B2
(45) Date of Patent: May 24, 2005

(54) SIGMA-DELTA CONVERTER ARRANGEMENT

(75) Inventors: Victor Dias, Neubiberg (DE); Josef Fenk, Eching/Ottenburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/888,065

(22) Filed: Jul. 9, 2004

(65) Prior Publication Data

US 2005/0030211 A1 Feb. 10, 2005

(30) Foreign Application Priority Data

Jul. 11, 2003 (DE) .......................................... 103 31 572

(51) Int. Cl.[7] .............................................. H03M 3/00
(52) U.S. Cl. ...................................... 341/143; 341/155
(58) Field of Search ................................ 341/143, 155, 341/118

(56) References Cited

U.S. PATENT DOCUMENTS

| | | | | |
|---|---|---|---|---|
| 5,608,400 | A | * | 3/1997 | Pellon ........................ 341/143 |
| 5,729,230 | A | * | 3/1998 | Jensen et al. ............... 341/143 |
| 6,404,367 | B1 | * | 6/2002 | Van der Zwan et al. .... 341/143 |
| 6,768,435 | B2 | * | 7/2004 | Xu .............................. 341/143 |
| 6,822,592 | B2 | * | 11/2004 | Gandolfi et al. ........... 341/143 |

FOREIGN PATENT DOCUMENTS

| | | |
|---|---|---|
| EP | 0 533 981 B1 | 3/1993 |
| GB | 2 378 831 A | 2/2003 |

OTHER PUBLICATIONS

"Continuous Time Sigma–Delta Modulators with Transmission Line Resonators and Improved Jitter and Excess Loop Delay Performance", L. Hernandez and S. Paton, Universidad Carlos III, May, 2003, 5 pgs.

"A 950–MHz IF Second–Order Integrated LC Bandpass Delta–Sigma Modulator", Weinan Gao and Martin Snelgrove, IEEE Journal of Solid–State Circuits, vol. 33, No. 5, May 1998, pp. 723–732.

* cited by examiner

Primary Examiner—Michael Tokar
Assistant Examiner—Linh V Nguyen
(74) Attorney, Agent, or Firm—Eschweiler & Associates LLC

(57) ABSTRACT

The invention discloses a sigma-delta converter arrangement with a forward path including an amplifier and a quantizer with a clock input, and a feedback path with a D/A converter. The amplifier is coupled to an integrator which is in the form of a resonator with a tunable frequency and is actuated by a frequency synthesizer that also prescribes the clock rate of the quantizer. The synchronization between the quantizer and resonator results in highly accurate matching given inexpensive integratabiliy, which means that the sigma-delta converter is suitable for use in mobile radios, for example.

19 Claims, 2 Drawing Sheets

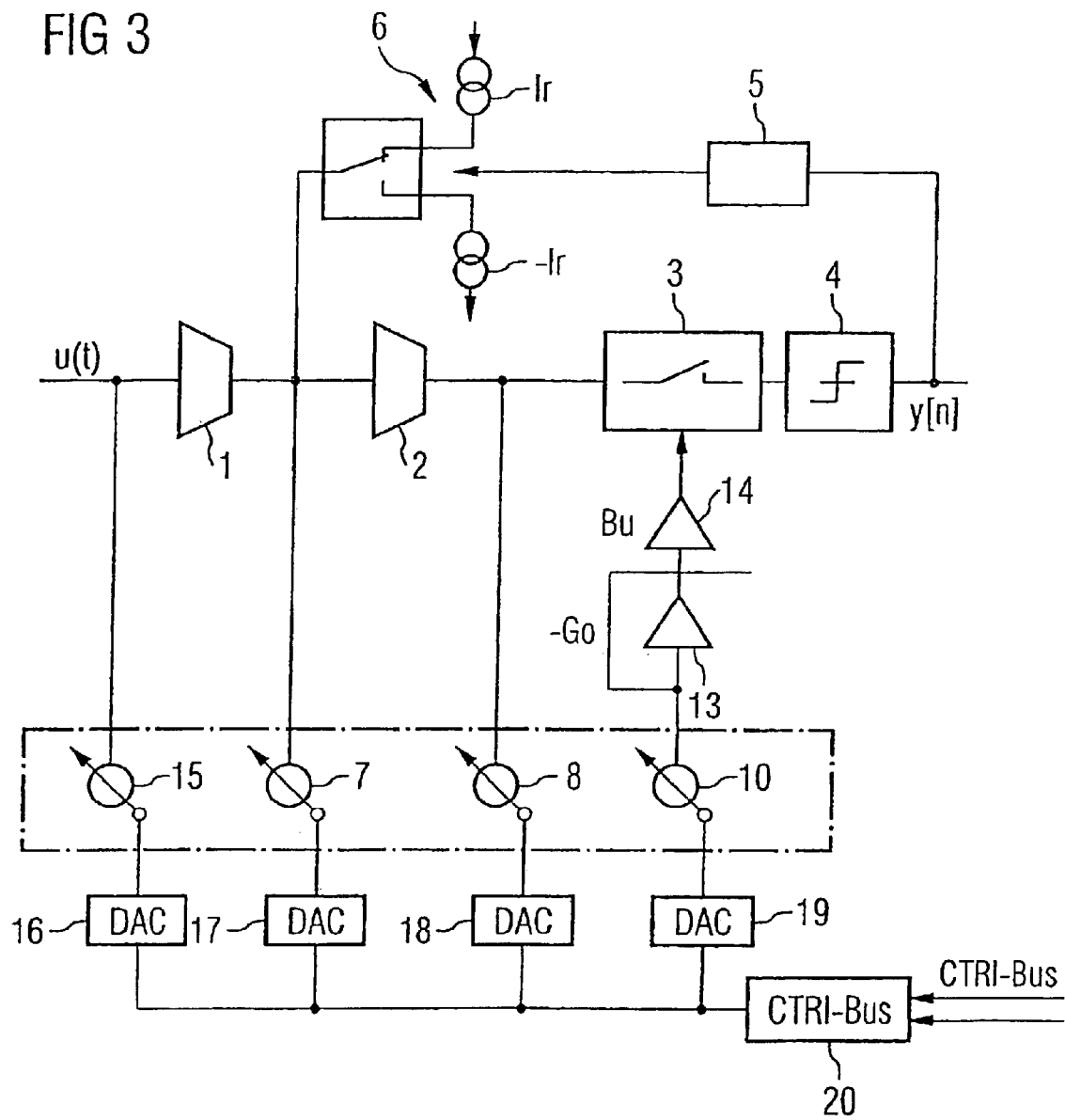

SIGMA-DELTA CONVERTER ARRANGEMENT

REFERENCE TO RELATED APPLICATIONS

This application claims the benefit of the priority date of German application DE 103 31 572.1, filed on Jul. 11, 2003, the contents of which are herein incorporated by reference in their entirety.

FIELD OF THE INVENTION

The present invention relates to a sigma-delta converter arrangement.

BACKGROUND OF THE INVENTION

Sigma-delta (SD) converters, which operate in continuous-time mode, are also referred to as CTSD (Continuous-Time Sigma-Delta) modulators.

Such sigma-delta converters, which can operate at clock rates entering the gigahertz range, are intended to be used, inter alia, for achieving digitization of radio frequency analog signals directly at the antenna of mobile radio reception appliances which operate, by way of example, on the basis of the GSM (Global System for Mobile Communication), UMTS (Universal Mobile Telecommunication System) or WLAN (Wireless Local Area Network) standard.

The fundamental, limiting factor when implementing such high speed CTSD modulators is the jitter problem for the clock source, which is necessary in order to define feedback impulses in the CTSD. Since the energy in such a feedback pulse is proportional to the respective pulse width, any jitter influencing the rising or falling edges of the pulse supplies an undesirable noise contribution. Other limiting factors are the power consumption, the loop delay and the circuit's maximum operating speed, which is prescribed by the production technology. However, the last three limiting factors mentioned have recently been able to be avoided by the following methods:

At a theoretical level, the impulse invariance transformation method has been developed, which allows a discrete-time SD modulator to be mapped into a continuous-time circuit. This method takes into account the hold function which is provided by the DA converter in the SD modulator's feedback path and is based either on a full clock period or on half a clock period.

The availability of low submicron CMOS production processes with transit frequencies markedly above 100 GHz pushes the operating speed of such SD converters a long way upward.

Novel solutions in circuit design allow CTSD modulators to be implemented with a sensible power consumption.

The document "Continuous Time Sigma-Delta Modulators with Transmission Line Resonators and Improved Jitter and Excess Loop Delay Performance", L. Hernandez, S. Paton, proposes an alternative theory for deriving a continuous-time SD modulator from a corresponding discrete-time model. In line with this theory, a CTSD converter's transfer function can be derived from that of a discrete-time modulator if the integrators in the continuous-time modulator are modeled using transfer lines. In this case, these are produced using quarter-lambda resonators. This printed document also infers that the equivalence between the two transfer functions means that the sensitivity toward jitter is reduced by orders of magnitude. This result is supported by simulations and a prototype with discrete components.

The fundamental drawback of the solution which arises in line with the document indicated above is that external transfer lines, namely the quarter-lambda resonators, are needed which are ceramic-quarter-lambda resonators in the present example. This not only makes this solution unattractive for mass production on account of high costs and the high space requirement for the external resonators but also means that the principle proposed is very sensitive toward mismatches between the electrical properties of the internal, namely integrated, and external components of the chip. In particular, problematical mismatches may arise between the quarter-lambda delay elements, which are produced by external transfer lines, and the clock rate of the clock generator, which defines the sampling rate for the quantizer in the SD converter's forward path.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one aspect of the present invention a sigma-delta modulator is disclosed that can operate in continuous-time mode, can be operated at clock rates entering the gigahertz range and is suitable for mass production.

In one aspect of the present invention, the sigma-delta converter arrangement comprises a series circuit between an input and an output on the sigma-delta converter arrangement, comprising at least one amplifier with a predetermined transfer function and a quantizer with a clock input. The sigma-delta arrangement further comprises a feedback path that connects the output of the series circuit to the input thereof and comprises a digital/analog converter. In addition, a resonator with a tunable frequency is provided, having an output coupled to the amplifier in order to form an integrator. Further, a frequency control block is provided that controls the frequency of the resonator with a tunable frequency and is coupled to the clock input of the quantizer.

In line with the proposed principle, the resonator realizing an integrator function is designed to have a tunable frequency. To control the frequency of the resonator, a frequency control block is provided that concurrently provides the clock frequency for the quantizer in the sigma-delta converter's forward path.

In such a case, the clock frequencies for the quantizer and the frequency at which the resonator is actuated do not necessarily need to be identical; however, the proposed principle provides for synchronization between the two frequencies or clock rates.

With the proposed tunable resonators as integrators in a sigma-delta converter arrangement, it is advantageously possible to dispense with external quarter-lambda delay lines.

The principle presented avoids the mismatches described above with respect to the prior art. In addition, coupling between the clock rate of the quantizer and the frequency and/or phase of the resonator operating as an integrator is ensured. This coupling is ensured with a frequency control block, which advantageously includes a phase locked loop, a frequency locked loop or other frequency synthesizers.

The frequency synthesizer preferably comprises loop filters or other components for frequency regulation.

The coupling between the frequency of the resonator and the clock frequency of the quantizer can also be attained using a negative impedance oscillator. The resonator with a tunable frequency may, by way of example, be in the form of a voltage controlled oscillator (VCO), as usually appears in phase locked loops. Since such a frequency or, phase locked loop also prompts generation of the clock signal for the quantizer, further improved matching is attained between the resonator with a tunable frequency and the quantizer. Such high quality VCOs can be produced without difficulty in CMOS, BICMOS or bipolar circuitry.

Alternatively, the resonator with a tunable frequency may also be in the form of a BAW (Bulk Acoustic Wave) resonator. Such BAW resonators can be produced without difficulty using silicon technology with a quality in the region of several thousand. BAW resonators can be produced using "multidie assembly", for example. This alternative also allows particularly good matching to be attained between the frequency of the integrator and the clock frequency of the quantizer.

In another alternative, the resonator with a tunable frequency may also be in the form of a ceramic resonator.

All of the resonators described, which are designed to have a tunable frequency, may either be integrated on a chip or produced as a separate component. The fact that they are designed to have a tunable frequency that is based on the clock rate of the quantizer means that no kinds of problems arise with mismatches or production variations.

To make the BAW resonator or the ceramic resonator tunable, a varactor diode may be added, for example. The varactor may be in the form of a tunable varactor diode connected in parallel with the actual resonator, for example.

The sigma-delta converter or sigma-delta modulator may be of single-stage or multi-stage design. The multi-stage SD converter preferably comprises a resonator with a tunable frequency in each stage, said resonator being controlled by the respective frequency synthesizer. In this arrangement, the resonators are preferably of the same design.

A digital/analog converter may be connected between the frequency control block and a tuning input on the tunable resonator. This makes it possible to adjust the offset value of the respective tuning signal independently of other resonators or components.

A further resonator which is designed to have a tunable frequency and preferably has the same design as the other tunable resonator(s) may advantageously be provided in the frequency synthesizer produced as a control loop. The resonators with a tunable frequency, which operate as integrators, are operated merely in controlled fashion in this case.

BRIEF DESCRIPTION OF THE DRAWINGS

The invention is explained in more detail below using a plurality of exemplary embodiments with reference to drawings, in which:

FIG. 3 shows a third exemplary embodiment of an inventive sigma-delta converter with actuation of the D/A converters by means of a control bus.

DETAILED DESCRIPTION OF THE INVENTION

Figure 1:
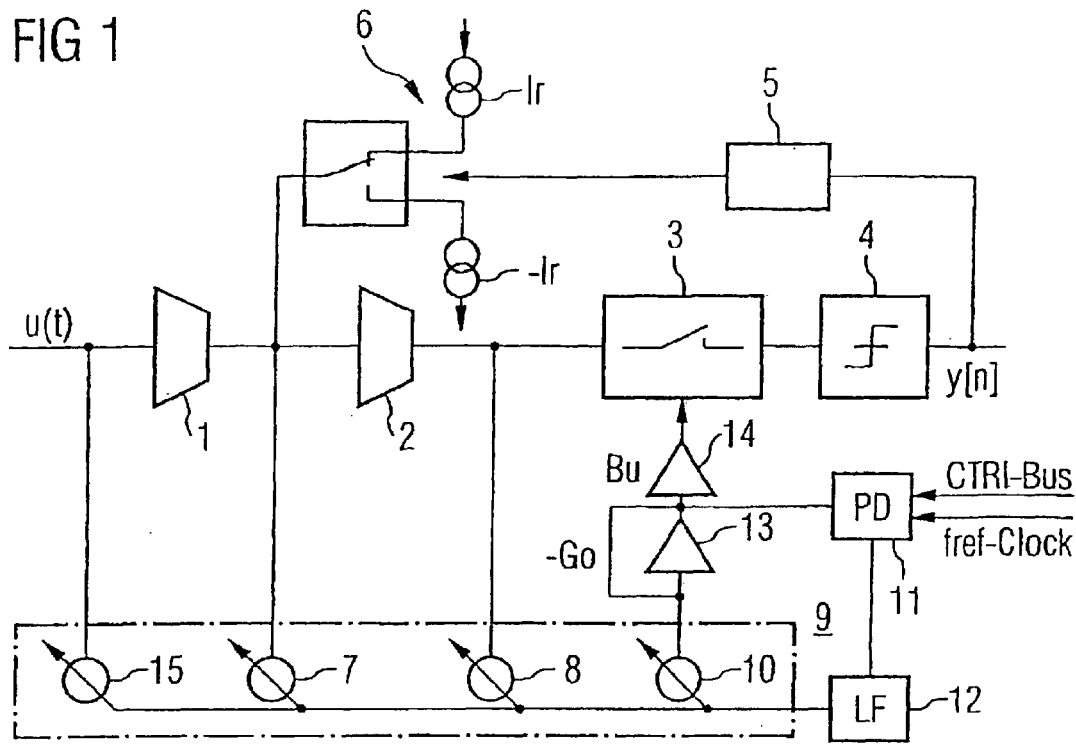
FIG. 1 shows a first exemplary embodiment of a continuous-time sigma-delta modulator according to the present invention.

FIG. 1 shows an exemplary embodiment of a sigma-delta modulator operating in continuous-time mode, which is also referred to as a sigma-delta converter. This is in the form of a second order modulator, for example. A forward path comprises a series circuit comprising a first amplifier 1, with a gradient $g_m$ of the reciprocal value of the impedance $Z_0$, and a further amplifier 2, which likewise has the gradient $g_m$ of the reciprocal impedance value $Z_0$. Connected downstream of the second amplifier 2 is a multicircuit switch 3 which has a clock control input to which a frequency $F_m$ is applied which corresponds to the reciprocal of the clock period T. Connected to the output of the switch 3 is a limiting amplifier 4 whose output forms the output of the sigma-delta modulator's forward path. The switch 3 and the limiter amplifier 4 together form a quantizer, which means that a discrete-time and discrete-value signal is produced at the output of the quantizer 3, 4. A feedback path 5, 6 connects the output of the quantizer 3, 4 to the circuit node which couples the first and second amplifiers 1, 2 to one another. The feedback path 5, 6 comprises a transfer element, which has the transfer function $z^{-1}$ in the z plane, and, downstream of this transfer element, a current source circuit 6 which outputs a positive current $I_r$ or a negative current $-I_r$ depending on the signal at the output of the function block 5. Overall, the feedback path 5, 6 has the function of a digital/analog converter.

Connected to the output side of the amplifiers 1, 2 is a respective resonator 7, 8, each of which can have its frequency tuned and which are of the same design. For the purpose of tuning, the resonators 7, 8 have a respective frequency control input. The resonators 7, 8 at the outputs of the amplifiers 1, 2 form a respective integrator. To control the frequency of the resonators 7, 8, a phase locked loop 9 is provided, which comprises a further resonator 10 whose output is connected to the input of a phase detector 11. The output of the phase detector 11 is routed to the frequency control input of the resonator 10 via a loop filter 12. The frequency control inputs of the resonators 7, 8 are also connected to the output of the loop filter 12. The phase detector 11 has further inputs for supplying a clock signal at a reference frequency $f_{ref}$ and for supplying digital information using a control bus CTRL-BUS. For the purpose of actuating the multicircuit switch 3 in the quantizer 3, 4, the output of the resonator 10 is also connected to the clock input of the switch 3 via two buffer amplifiers 13, 14. In this arrangement, the amplifier 13 is in the form of a negative impedance amplifier $-G_0$ which reduces the damping of the resonator 10. The amplifier 14 connected downstream of the amplifier 13 is in the form of a buffer amplifier.

To improve the operability of the sigma-delta converter further, yet another resonator 15 with a controllable frequency is provided. The frequency control input of the resonator 15 is connected to the output of the loop filter 12, like that of the other resonators. The output of the resonator with a controllable frequency 15 is connected to the input of the first amplifier 1 and thus to the input of the sigma-delta modulator.

The coupling between the resonator 10 and the damping reduction amplifier 13 results in a system that can oscillate. The output of the damping reduction amplifier 13 feeds both the quantizer 3, 4, via the buffer amplifier 14, and the phase detector 11 in the phase locked loop 9. The phase detector block 11 also comprises further function blocks (not shown), such as a charge pump circuit, a frequency divider etc. The control bus at the input of the phase detector block 11 is used to control frequency divider ratios, charge pump currents etc. By way of example, the reference frequency for the phase detector 11 is provided using a crystal oscillator or another external reference. The loop filter 12 is used to route a tuning signal to the varactors 7, 8, 10, 15, which in the present example are in the form of LC oscillators, i.e. comprise an inductance and a capacitance as elements that determine the frequency of oscillation. The resonators 7, 8 both operate as transfer lines and thus form integrators. The resonators 7, 8 have practically the same resonant frequency as the resonator 10, which oscillates almost at the center frequency in combination with the damping reduction amplifier 13. A slight delay caused by the damping reduction amplifier 13 may result in a few degrees of a phase offset, which can in turn result in a few degrees of frequency offset. This does not greatly impair the overall operation of the circuit arrangement, however.

The additional resonator 15 has the function of an additional anti-aliasing filter at the input of the sigma-delta converter. In addition, the resonator 15 has the function of a "preselector" for frequency preselection. The resonator 15 is not required for the basic operation of the converter, but can further improve its performance and serves as an input filter.

In the present case, the resonators 7, 8, 10, 15 are all of the same design, in the form of LC parallel resonant circuits. These are designed to have a tunable frequency, for which purpose a varactor diode is preferably provided as the tunable component in the LC resonant circuit. Alternatively, the resonators 7, 8, 10, 15 may also be in the form of ceramic resonators with a parallel-connected tuning varactor, however.

The resonators 7, 8, 10, 15 are in the form of integrated components in the present case. When a conventional silicon process is used, this results in a quality in the range of greater than 10. Alternatively, the varactors may also be in the form of discrete components or may be produced using discrete components, which allows a quality of greater than 15 to be attained.

If discrete components are used which comprise a passive integrated varactor and a passive integrated inductance in silicon, it is also possible to attain a quality of greater than 20. In this case, the resonator can be connected to the primary circuit using bonding wires, using flipchip assembly or using other technologies, for example.

As another alternative, the resonators 7, 8, 10, 15 may also be in the form of FBAR (Film Bulk Acoustic Resonator) resonators, based on a silicon production method, respectively connected in parallel with a varactor. Ceramic resonators or FBAR resonators which are connected in parallel with a varactor diode result in a higher quality factor than the parallel LC oscillator, but the LC oscillator has the advantage of a wider tuning range.

The proposed sigma-delta modulator operating in continuous-time mode operates at a higher quality and is able to digitize analog signals at a low or high frequency. Preferably, the sigma-delta converter proposed is used in radio receivers operating on the basis of the GSM, WLAN, Bluetooth or UMTS standard, for example. The sigma-delta converter proposed has low jitter and low noise and can operate at clock rates entering the gigahertz range. This allows radio frequency signals to be digitized directly at the antenna of a receiver.

It goes without saying that, instead of the second order converter arrangement proposed, it is also possible to produce a lower or higher order converter than shown in FIG. 1 using the proposed principle.

The proposed solution guarantees good matching between the components and function blocks used and a synchronized response between the resonators and the quantizer's clock rate.

Instead of the phase locked loop 9, it is also possible to use a frequency locked loop (FLL) or other frequency synthesis device.

Figure 2:
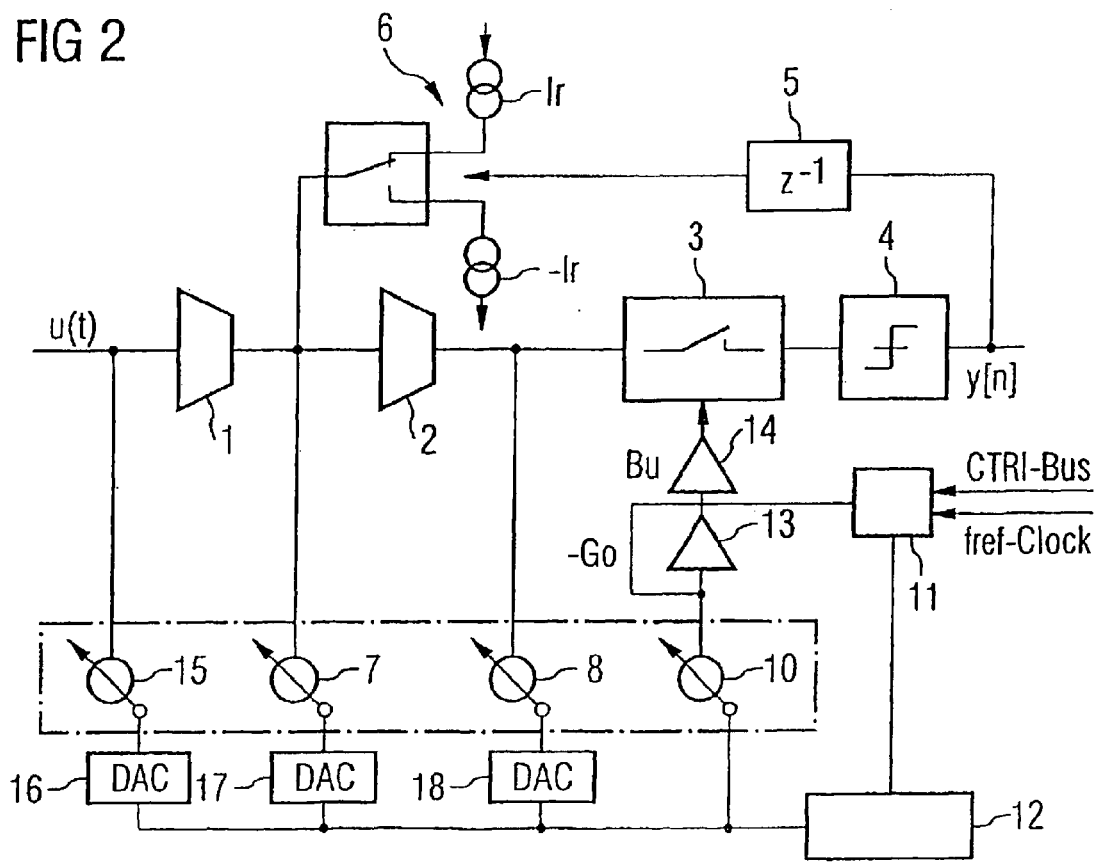
FIG. 2 shows a development of the exemplary embodiment from FIG. 1 with an independently adjustable offset voltage for actuating the resonators with a tunable frequency.

FIG. 2 shows a development of the sigma-delta converter arrangement from FIG. 1. The two exemplary embodiments shown in FIGS. 1 and 2 are closely matched in terms of the components used, the interconnection thereof and the resultant, advantageous mode of action. To this extent, the description of the figure is not repeated at this point.

In addition, the converter arrangement in FIG. 2 has a plurality of digital/analog converters 16, 17, 18 which are respectively connected between the output of the loop filter 12 and the tuning inputs of the resonators 15, 7, 8. With the additional digital/analog converters 16, 17, 18, it is advantageously possible to adjust the offset voltage of the tuning signal for the resonators 7, 8, 15 independently of one another and independently of the control voltage.

FIG. 3 shows an exemplary, alternative embodiment of the sigma-delta converter arrangement from FIG. 1, in which each of the four resonators 7, 8, 10, 15 is preceded by a digital/analog converter 17, 18, 19 whose input is in turn coupled to the output of a control block 20. The control block 20 has a plurality of inputs, inter alia for supplying a control bus. The control block 20 replaces the phase locked loop 9 in FIG. 1. The frequency of the resonator 10 is thus merely subjected to open-loop control, not to closed loop control. Advantageously, the control block 20 has a table which knows the association between the tuning voltage for the resonator 10 and the resultant frequency and which may also be calibrated if appropriate.

Advantageously, all of the tuning voltages for all of the resonators in the circuit in FIG. 3 can be adjusted using analog/digital converters 16 to 19 and the control bus on the control block 20, which means that offset control is possible independently of the tuning voltage supplied by the control block.

It goes without saying that the scope of the invention also allows the proposed principle to be transferred to sigma-delta converters with designs other than that shown.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

LIST OF REFERENCE NUMERALS

1 Amplifier
2 Amplifier
3 Multicircuit switch
4 Limiter
5 1/z block
6 Current source circuit
7 Resonator
8 Resonator
9 PLL
10 Resonator
11 Phase detector
12 Loop filter
13 Damping reduction amplifier
14 Buffer
15 Resonator
16 D/A converter
17 D/A converter
18 D/A converter
19 D/A converter
20 Control block

What is claimed is:

1. A sigma-delta converter, comprising:
    a series circuit between an input and an output of the sigma-delta converter, the series circuit comprising at least one amplifier with a predetermined transfer function and a quantizer with a clock input;
    a feedback path which connects the output of the series circuit to the input thereof, wherein the feedback path comprises a digital/analog converter;
    a resonator with a tunable resonant frequency, the resonator having an output coupled to the amplifier to form an integrator; and
    a frequency control block configured to control a resonant frequency of the resonator, the frequency control block further coupled to a clock input of the quantizer.

2. The sigma-delta converter of claim 1, wherein the quantizer comprises a switch and a limiter amplifier coupled together in series, wherein a control terminal of the switch comprises a clock input of the quantizer that is coupled to the frequency control block.

3. The sigma-delta converter of claim 1, further comprising a digital/analog converter coupled between the frequency control block and a tuning input of the resonator.

4. The sigma-delta converter of claim 1, wherein the frequency control block comprises a frequency synthesizer with a control loop, wherein the control loop comprises a phase or frequency comparator, a loop filter, and a further resonator with a tunable resonant frequency.

5. The sigma-delta converter of claim 4, wherein the further resonator with a tunable resonant frequency is coupled to the quantizer and configured to supply a reference clock to the clock input of the quantizer.

6. The sigma-delta converter of claim 4, wherein the resonator with a tunable resonant frequency and the further resonator with a tunable resonant frequency have an identical design.

7. The sigma-delta converter of claim 4, further comprising yet another resonator with a tunable resonant frequency coupled between the input of the sigma-delta converter and the frequency control block, wherein the yet another resonator is configured for preselection.

8. The sigma-delta converter of claim 1, wherein the series circuit comprises two series-connected amplifiers, wherein one is coupled to the input of the sigma-delta converter and the other is coupled to the quantizer, and further comprising another resonator with a tunable resonant frequency coupled to the other amplifier to form another integrator, wherein the sigma-delta converter comprises a multi-stage converter.

9. The sigma-delta converter of claim 1, wherein the resonator with a tunable resonant frequency comprises a tunable LC oscillator.

10. The sigma-delta converter of claim 1, wherein the resonator with a tunable resonant frequency comprises a ceramic resonator.

11. The sigma-delta converter of claim 1, wherein the resonator with a tunable resonant frequency comprises a BAW resonator.

12. The sigma-delta converter of claim 1, wherein the resonator comprises a voltage controlled oscillator.

13. The sigma-delta converter of claim 1, wherein the frequency control block is configured to synchronize a frequency of the resonator and the quantizer.

14. A sigma-delta converter, comprising:
    an amplifier having an input comprising an input of the sigma-delta converter, and having an output;
    a quantizer having an input coupled to the output of the amplifier, and having an output comprising an output of the sigma-delta converter;
    a digital/analog converter coupled between the output of the sigma-delta converter and the amplifier, the digital/analog converter comprising a feedback path;
    a resonator configured to operate at a plurality of resonant frequencies coupled to the amplifier to form an integrator; and
    a frequency control block configured to vary the resonant frequency of the resonator, the frequency control block further coupled to a clock input of the quantizer.

15. The sigma-delta converter of claim 14, wherein the frequency control block further controls a frequency of the quantizer, and is operable to synchronize the resonator and the quantizer.

16. The sigma-delta converter of claim 14, further comprising a digital/analog converter coupled between the frequency control block and a tuning input of the resonator.

17. The sigma-delta converter of claim 14, wherein the frequency control block comprises a frequency synthesizer with a control loop, wherein the control loop comprises a phase or frequency comparator, a loop filter, and a further resonator with a tunable resonant frequency.

18. The sigma-delta converter of claim 17, wherein the further resonator in the frequency control block is coupled to the quantizer and configured to supply a reference clock to a clock input of the quantizer.

19. The sigma-delta converter of claim 4, further comprising yet another resonator with a tunable resonant frequency coupled between the input of the sigma-delta converter and the frequency control block, wherein the yet another resonator is configured for preselection.

* * * * *